(12) United States Patent
Abbott

(10) Patent No.: US 10,438,816 B2
(45) Date of Patent: Oct. 8, 2019

(54) SELECTIVE PLANISHING METHOD FOR MAKING A SEMICONDUCTOR DEVICE

(71) Applicant: TEXAS INSTRUMENTS INCORPORATED, Dallas, TX (US)

(72) Inventor: Donald C. Abbott, Chatley, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/913,499

(22) Filed: Mar. 6, 2018

(65) Prior Publication Data

US 2018/0204739 A1 Jul. 19, 2018

Related U.S. Application Data

(60) Continuation-in-part of application No. 14/684,848, filed on Apr. 13, 2015, now Pat. No. 9,972,506, which is a continuation of application No. 13/937,590, filed on Jul. 9, 2013, now Pat. No. 9,006,038, which is a division of application No. 13/462,574, filed on May 2, 2012, now Pat. No. 8,587,099.

(51) Int. Cl.
| | |
|---|---|
| *H01L 21/48* | (2006.01) |
| *H01L 21/56* | (2006.01) |
| *H01L 21/64* | (2006.01) |
| *H01L 23/495* | (2006.01) |
| *H01L 23/00* | (2006.01) |

(52) U.S. Cl.
CPC ...... *H01L 21/4842* (2013.01); *H01L 21/4821* (2013.01); *H01L 21/561* (2013.01); *H01L 21/64* (2013.01); *H01L 23/49503* (2013.01); *H01L 23/49541* (2013.01); *H01L 23/49548* (2013.01); *H01L 23/49575* (2013.01); *H01L 24/85* (2013.01); *H01L 24/97* (2013.01); *H01L 23/49565* (2013.01); *H01L 2224/05599* (2013.01); *H01L 2224/85* (2013.01); *H01L 2924/0002* (2013.01); *H01L 2924/00014* (2013.01); *H01L 2924/181* (2013.01); *H01L 2924/2064* (2013.01); *Y10T 29/49121* (2015.01)

(58) Field of Classification Search
CPC ..... H01L 21/48; H01L 21/4821; H01L 21/64; H01L 23/495; H01L 23/49503; H01L 23/49541; H01L 23/49565; H01L 23/49575

See application file for complete search history.

(56) References Cited

U.S. PATENT DOCUMENTS

| | | |
|---|---|---|
| 3,719,536 A | 3/1973 | Rheingold et al. |
| 3,939,559 A | 2/1976 | Fendley et al. |

(Continued)

*Primary Examiner* — Mary A Wilczewski
(74) *Attorney, Agent, or Firm* — Rose Alyssa Keagy; Charles A. Brill; Frank D. Cimino

(57) ABSTRACT

In a method for fabricating semiconductor devices a leadframe pattern is formed from a flat tape of base metal. A plurality of additional metal layers is plated on the patterned tape of base metal. The surface of the metal layers is roughed. A plurality of sites for assembling semiconductor chips are created. The sites alternate with zones for connecting the leadframe pattern to molding compound runners A selected first set of leadframe areas are selectively planished creating flattened areas offsetting a second set of leadframe areas. A semiconductor chip is attached to each site.

10 Claims, 7 Drawing Sheets

(56) References Cited

U.S. PATENT DOCUMENTS

| | | |
|---|---|---|
| 4,003,073 A | 1/1977 | Helda et al. |
| 4,132,856 A | 1/1979 | Hutchison et al. |
| 5,070,039 A | 12/1991 | Johnson et al. |
| 5,196,725 A | 3/1993 | Mita et al. |
| 5,304,844 A | 4/1994 | Horiuchi et al. |
| 5,437,096 A | 8/1995 | Mennucci |
| 5,622,896 A | 4/1997 | Knotter et al. |
| 5,637,913 A | 6/1997 | Kajihara et al. |
| 5,637,916 A | 6/1997 | Joshi |
| 5,659,950 A | 8/1997 | Adams et al. |
| 5,677,245 A | 10/1997 | Brown et al. |
| 5,682,673 A | 11/1997 | Fehr |
| 5,683,943 A | 11/1997 | Yamada |
| 5,773,878 A | 6/1998 | Lim et al. |
| 5,939,778 A | 8/1999 | Boutin et al. |
| 5,946,198 A | 8/1999 | Hoppe et al. |
| 6,008,068 A | 12/1999 | Yamada |
| 6,064,115 A | 5/2000 | Moscicki |
| 6,197,615 B1 | 3/2001 | Song et al. |
| 6,229,200 B1 | 5/2001 | Mclellan et al. |
| 6,348,729 B1 | 2/2002 | Li et al. |
| 6,534,861 B1 | 3/2003 | Castro |
| 6,600,335 B2 | 7/2003 | Tay et al. |
| 7,368,807 B2 | 5/2008 | Abbott |
| 7,415,688 B2 | 8/2008 | Sakakibara |
| D588,080 S | 3/2009 | Harnden et al. |
| D588,557 S | 3/2009 | Harnden et al. |
| 7,504,735 B2 | 3/2009 | Shimizu et al. |
| 7,637,913 B2 | 12/2009 | De Villiers et al. |
| 7,678,617 B1 | 3/2010 | Bayan |
| 8,133,763 B2 | 3/2012 | Koduri |
| 8,184,453 B1 | 5/2012 | Kim et al. |
| 8,188,583 B2 | 5/2012 | Arita et al. |
| 8,338,927 B2 | 12/2012 | Nakamura et al. |
| 8,377,751 B2 | 2/2013 | Amanai et al. |
| 8,432,023 B1 | 4/2013 | Kim et al. |
| 8,435,867 B2 | 5/2013 | Fujishima et al. |
| 8,441,110 B1 | 5/2013 | Choi |
| 8,575,742 B1 | 11/2013 | Kim et al. |
| 8,587,099 B1 | 11/2013 | Abbott |
| 8,610,254 B2 | 12/2013 | Zhao |
| 8,674,485 B1 | 3/2014 | Kim et al. |
| 8,829,685 B2 | 9/2014 | Fukushima et al. |
| 8,866,278 B1 | 10/2014 | Bae et al. |
| 8,963,300 B2* | 2/2015 | Abbott .............. H01L 23/49541 257/666 |
| 8,969,300 B2 | 3/2015 | Rasmussen |
| 9,006,038 B2* | 4/2015 | Abbott .............. H01L 23/49541 438/123 |
| 9,136,256 B2* | 9/2015 | Joshi .................... H01L 25/165 |
| 9,153,383 B2* | 10/2015 | Chen .................... H01G 9/0029 |
| 9,355,946 B2* | 5/2016 | Joshi .................... H01L 25/165 |
| 9,437,367 B2* | 9/2016 | Chen .................... H01G 9/0029 |
| 9,972,506 B2* | 5/2018 | Abbott ............. H01L 23/49541 |
| 2003/0006488 A1 | 1/2003 | Wakabayashi et al. |
| 2003/0071333 A1 | 4/2003 | Matsuzawa |
| 2003/0203539 A1 | 10/2003 | Islam et al. |
| 2006/0189037 A1 | 4/2006 | Abbott |
| 2006/0097366 A1 | 5/2006 | Sirinorakul et al. |
| 2008/0012101 A1 | 1/2008 | Zuniga-Ortiz et al. |
| 2008/0083972 A1 | 4/2008 | Johnson |
| 2009/0166828 A1 | 7/2009 | Upadhyayula et al. |
| 2009/0315159 A1 | 12/2009 | Abbott |
| 2010/0062570 A1 | 3/2010 | Test |
| 2010/0219520 A1 | 9/2010 | Sung et al. |
| 2010/0295161 A1 | 11/2010 | Koduri |
| 2010/0325885 A1 | 12/2010 | Shimazaki et al. |
| 2011/0001227 A1 | 1/2011 | Ano |
| 2011/0108965 A1 | 5/2011 | Hess et al. |
| 2012/0248588 A1 | 10/2012 | Yamabe |
| 2012/0306065 A1 | 12/2012 | Bin Mohd Arshad |
| 2013/0070452 A1 | 3/2013 | Urano et al. |
| 2013/0292811 A1 | 11/2013 | Abbott |
| 2013/0298393 A1 | 11/2013 | Abbott |
| 2014/0035113 A1 | 2/2014 | Kierse |
| 2014/0048920 A1 | 2/2014 | Abbott |
| 2014/0151865 A1 | 6/2014 | Koschmieder |
| 2014/0167240 A1 | 6/2014 | Chew et al. |
| 2014/0268503 A1* | 9/2014 | Chen .................... H01G 9/0029 361/529 |
| 2015/0214198 A1* | 7/2015 | Lee .................... H01L 23/49575 361/753 |
| 2015/0221526 A1* | 8/2015 | Abbott .............. H01L 23/49541 438/112 |
| 2015/0235999 A1* | 8/2015 | Joshi .................... H01L 25/165 257/676 |
| 2015/0262918 A1* | 9/2015 | Tran .................... H01L 21/4842 257/676 |
| 2015/0262919 A1* | 9/2015 | Tran .................. H01L 23/49503 257/676 |
| 2015/0348890 A1* | 12/2015 | Joshi .................... H01L 25/165 257/675 |
| 2015/0371783 A1* | 12/2015 | Chen .................... H01G 9/0029 29/25.03 |
| 2016/0005712 A1* | 1/2016 | Tran .................... H01L 21/4842 438/112 |
| 2016/0027721 A1 | 1/2016 | Lee et al. |
| 2018/0204739 A1* | 7/2018 | Abbott .............. H01L 23/49541 |

\* cited by examiner

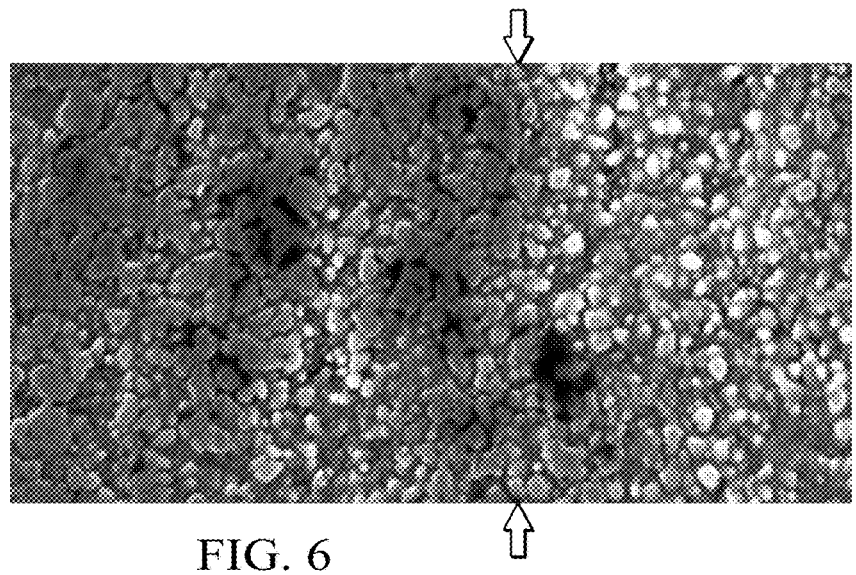
FIG. 6
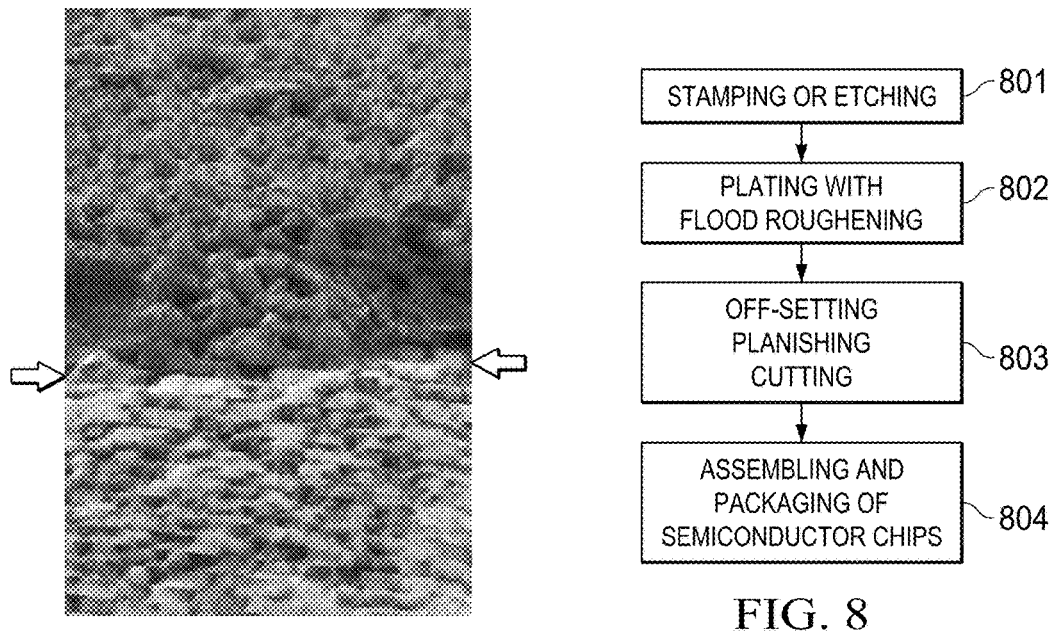
FIG. 7
FIG. 8

SELECTIVE PLANISHING METHOD FOR MAKING A SEMICONDUCTOR DEVICE

CROSS REFERENCE TO RELATED APPLICATIONS

This application is a Continuation-In-Part of and claims priority to U.S. Ser. No. 14/684,848, filed Apr. 13, 2015, which is a Continuation of and claims priority to U.S. Ser. No. 13/937,590 filed on Jul. 9, 2013—now U.S. Pat. No. 9,006,038 that is a Divisional of and claims priority to U.S. Ser. No. 13/462,574 filed on May 2, 2012—now U.S. Pat. No. 8,587,099, the entire contents of all are incorporated herein by reference.

FIELD

The embodiments of the invention are related in general to the field of semiconductor devices and processes, and more specifically to the structure and fabrication process of flood-plated rough metallic leadframes in semiconductor packages having selectively planished portions to reduce the leadframe adhesion to molding compound in zones exposed to compound in mold runners.

DESCRIPTION OF RELATED ART

Based on their functions, semiconductor packages include a variety of different materials. Metals formed as leadframes and bonds are employed for mechanical stability and electrical and thermal conductance, and insulators, such as polymeric molding compounds, are used for encapsulations and form factors. In the packaging fabrication flow, it is common practice to attach a plurality of semiconductor chips to a strip of leadframe, to connect the chips to their respective leads, and then to encapsulate the assembled chips in packages, which protect the enclosed parts against mechanical damage and environmental influences such as moisture and light while providing trouble-free electrical connections. After the encapsulation step, the package chips are separated from the leadframe strip into discrete units by a trimming and forming step.

A popular encapsulation technique is the transfer molding method. A leadframe strip with the attached and connected chips is placed in a steel mold, which forms a cavity around each assembled chip. A semi-viscous thermoset polymeric compound is pressured through runners across the leadframe strip to enter each cavity through a gate. After filling the cavities, the compound is allowed to harden by polymerization. Finally, in the degating step, the compound in the runner is broken off at each gate from the compound filling the cavity.

To ensure the unity and coherence of the package, the metallic and non-metallic materials are expected to adhere to each other during the lifetime of the product, while tolerating mechanical vibrations, temperature swings, and moisture variations. Failing adhesion would allow moisture ingress into the package, causing device failure by electrical leakage and chemical corrosion.

Today' semiconductor technology employs a number of methods to raise the level of adhesion between the diversified materials so that the package passes accelerated tests and use conditions without delamination. As an example, the adhesion between copper-based leadframes and epoxy-based molding compounds and chip-attach compounds can be improved by adding design features such as indentations, grooves or protrusions to the leadframe surface. Another example to improve adhesion is the method of chemically modifying the leadframe surface by oxidizing the metal surface, for instance creating copper oxide.

Another example of known technology to increase adhesion between leadframe, chip, and encapsulation compound in semiconductor packages, is the roughening of the whole leadframe surface by chemically etching the leadframe surface after stamping or etching the pattern from a metal sheet. Chemical etching is a subtractive process using an etchant. Chemical etching creates a micro-crystalline metal surface with a roughness on the order of 1 µm or less. To roughen only one surface of the leadframe adds about 10 to 15% cost to the non-roughened leadframe.

Yet another known method to achieve a rough surface is the use of a specialized metal plating bath, such as a nickel plating bath, to deposit a rough metal (such as nickel) layer. This method is an additive process; the created surface roughness is on the order of 1 to 10 µm. Roughening of the leadframe surface may have some unwelcome side effects. General roughening of the surface impacts wire bonding negatively, since vision systems have trouble seeing the roughened surface; the rough surface shortens capillary life; and micro-contaminants on the rough surface degrades bonding consistency. General rough surfaces tend to allow more bleeding, when the resin component separates from the bulk of the chip attach compound and spreads over the surface of the chip pad; the resin bleed, in turn, can degrade moisture level sensitivity and interfere with down bonds on the chip pad.

In order to avoid these disadvantages, a selective roughening technique is sometimes employed, which involves reusable silicone rubber masks or gaskets; consequently, selective roughening is expensive. For example, protective masks to restrict the chemical roughening to the selected leadframe areas add about 35 to 40% cost to the non-roughened leadframe.

SUMMARY

Among dominating market trends for semiconductor products are the demand for increased insensitivity against temperature variations and moisture level exposure, and the need to keep fabrication cost down by employing inexpensive process steps. For semiconductor packages, the first trend implies an increased need for creating reliable adhesion between the different package parts and maintaining the adhesion through mechanically rough process steps, such as degating, deflashing, and trimming and forming. The second trend implies a necessity to avoid expensive process techniques such as selective plating and to select inexpensive process steps throughout such as flood plating.

For reliable adhesion, applicant recognized that besides chemical affinity between the molding compound and the metal finish of the leadframe, the surface roughness of the leadframe is essential, especially in view of the technical trend of shrinking package dimensions, offering ever less surface area for adhesion. In addition, the requirement to use lead-free solders pushes the reflow temperature range into the neighborhood of about 260° C., making it more difficult to maintain mold compound adhesion to the leadframes.

Analyzing quality and productivity issues of molded plastic devices, applicant observed that the process steps of degating after molding frequently causes deformation of the leadframe during the gate removal step. As a consequence of this deformation, yield losses of approximately 5% may occur at the process step of trimming-and-forming.

In a careful failure analysis, applicant discovered as the root cause of the leadframe deformation the enhanced adhesion between the roughened leadframe surfaces and the molding compound in zones such as the mold runners where the plastic crosses the leadframe strip outside the package.

Applicant saw that cost reduction pressures in many product lines exclude a solution of this problem by selective roughening of the leadframe surface using masks such as costly dry film photoresists. Likewise, modifying the auto-molding equipment for degating is too expensive. Further, efforts for removing leadframe material by design change in the gate area have not been effective.

Applicant solved the degating and deflashing problem while maintaining low-cost leadframe roughening methods when he discovered that locally un-roughened surfaces can be obtained by adding a planishing station to the offset-and-cutting tool already in use. While requiring no extra process step, the planishing station selectively lightly coins, or planishes, the rough surface locally in the gate area to remove the rough texture. The planishing process has been especially effective in stamped or etched leadframes with flood-roughened surfaces of plated nickel or nickel-palladium-gold layers.

One embodiment of the invention is a method for fabricating plastic semiconductor devices on a strip of leadframe including the step of stamping, or etching, the base metal strip to form the leadframe geometry, followed by the step of plating with flood roughening metal layers such as nickel on the base metal. For the next step of planishing, this operation is preferably performed in conjunction with the standard operations of leadframe offsetting and cutting by a single tool, a press. For the planishing portion, a planishing station has been added to the press, which is suitable to selectively and lightly coin local leadframe areas in order to flatten the rough texture. The planished areas partially regain the reflective, shiny surface appearance of the leadframe right after the stamping or etching step. Using a slightly altered existing tool means that no extra process step needs to be inserted into the fabrication flow.

Another embodiment of the invention is a leadframe strip as used for semiconductor device fabrication, which exhibits, before the step of molding encapsulation, optically matte appearing zones of roughened surface alternating with optically shiny appearing zones of smoothed surface. While the smoothed surface appears shiny, it is microscopically not as flat as the leadframe base material without roughening.

BRIEF DESCRIPTION OF THE DRAWINGS

FIG. 6 is a microscopic picture of a planished leadframe surface (left portion) adjacent to a rough-plated surface (right portion) (5000×).

FIG. 7 is a microscopic picture of a step transitioning a planished leadframe zone (bottom portion) and a rough-plated zone (top portion) (8000×).

FIG. 8 is a schematic diagram of the process flow of selective leadframe planishing.

DETAILED DESCRIPTION OF THE PREFERRED EMBODIMENTS

Figure 1A:
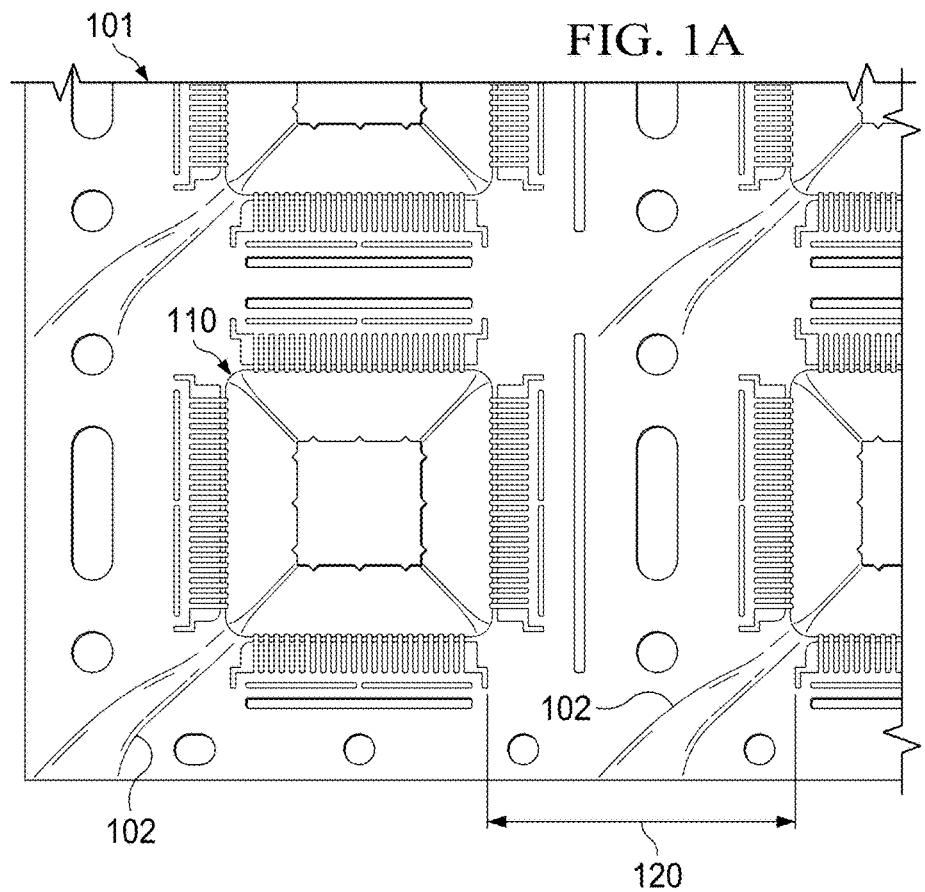
FIG. 1A shows a top view of a portion of a leadframe strip with molded devices after degating.

FIG. 1A illustrates a portion of an exemplary leadframe strip 101 with molded semiconductor devices 110 after the strip has been removed from the mold press, in which the encapsulation process by molding had been completed. A leadframe strip is preferably etched or stamped from a thin sheet of base metal such as copper, copper alloy, iron-nickel alloy, aluminum, Kovar™, and others, in a typical thickness range from 120 to 250 μm. The technology trend is towards thinner leadframes. As used herein, the term base metal has the connotation of starting material and does not imply a chemical characteristic.

A leadframe provides a stable support pad for firmly positioning the semiconductor chip. Further, a leadframe offers a multitude of conductive leads to bring various electrical conductors into close proximity of the chip. Any remaining gap between the tip of the leads and the chip terminals is typically bridged by thin bonding wires; alternatively, in flip-chip technology the chip terminals may be connected to the leads by metal bumps. For the leadframe, the desired shape of pad, leads, and other geometrical features are etched or stamped from the original metal sheet. When required by leadframe functionality and within certain limits, the thinness of the base metal and the fine features of the leads allow a forming process by an external force acting on those leads with the goal of creating leadframe portions in a plane offset from the plane of the starting sheet. An outside force, applied along the length of a lead, can stretch the lead in the direction of the length, while the dimension of the width is only slightly reduced, so that the new shape appears elongated. For elongations small compared to the length, and up to a limit called the elastic limit given by the metal characteristics, the amount of elongation is linearly proportional to the force.

As pointed out below, the possibility of affecting leadframe features by external forces may have an undesirable side effect, whereby yield-reducing deformations of leadframe portions can be created unintentionally in zones 120 between encapsulated devices.

It is an irrevocable leadframe characteristic to facilitate reliable adhesion to the attached chip and to encapsulation compounds. Besides chemical affinity between the molding compound and the metal finish of the leadframe, reliable adhesion necessitates leadframe surface roughness, especially in view of the technical trend of shrinking package dimensions, which offers ever less surface area for adhesion.

In addition, the requirement to use lead-free solders pushes the reflow temperature range into the neighborhood of about 260° C., making it more difficult to maintain mold compound adhesion to the leadframes at elevated temperatures.

In order to keep fabrication cost low, the preferred method of roughening the leadframe surface is flood roughening included in the plating process of layers such as nickel. The roughening is preferably applied on both leadframe surfaces. A leadframe strip with roughened surface is then used to attach the semiconductor chip onto the pad, to connect the chip terminals to the respective leadframe leads by wire-bonding or flip-chip assembly, and finally to place the assembled strip in a steel mold press for encapsulating the assembled devices. The bottom and top halves of the steel mold are designed to form individual cavities for each device of the leadframe strip. Each cavity has a precision entry gate through which the molding compound will be pressed to fill the respective cavity in a controlled fashion. The compound, in turn, is supplied to the gates in runners engraved in the mold steel. During the molding process, the compound in the runners contacts the roughened leadframe surface on its way to each gate.

Figure 1B:
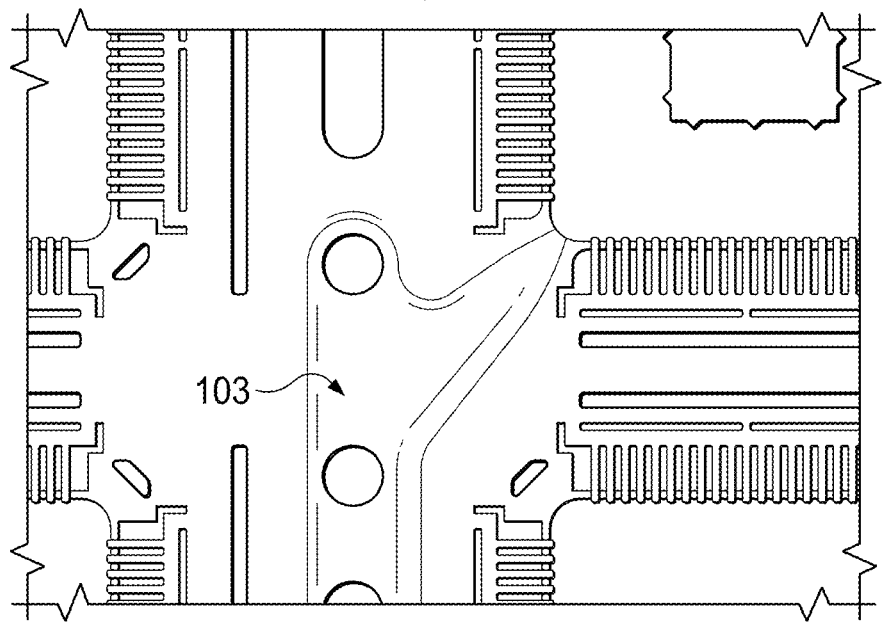
FIG. 1B shows a close-up view of an optical trace of a leadframe deformation caused by pulling away hardened molding compound, which adhered to the roughened leadframe surface.
Figure 1C:
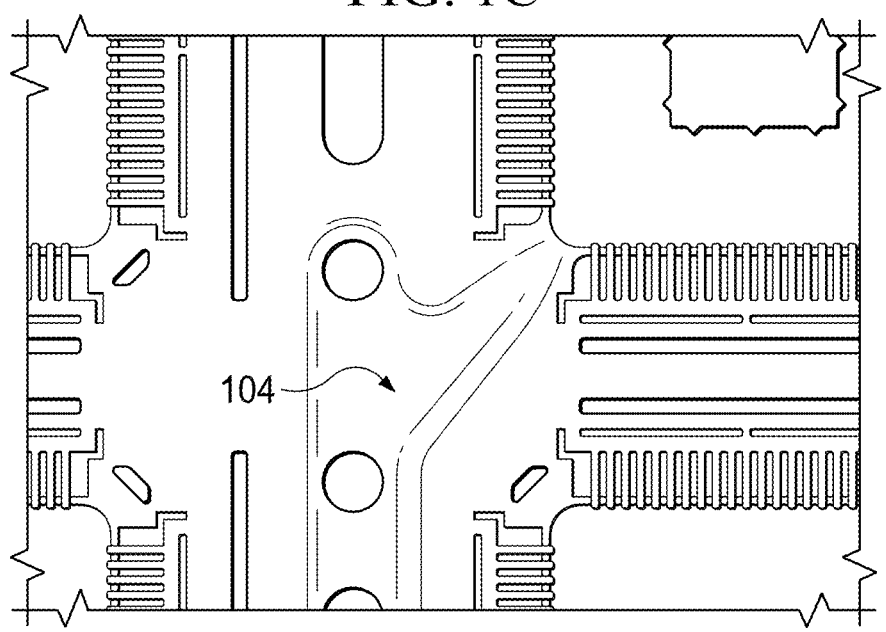
FIG. 1C shows another close-up view of an optical trace of a leadframe deformation caused by pulling away hardened molding compound, which adhered to the roughened leadframe surface.

After filling the cavities with compound and polymerizing (hardening) the compound, the top mold half is lifted so that the leadframe strip with the encapsulated devices can be removed from the press. At this stage, the hardened compound in the runners remains on the strip, since the compound adheres to the roughened leadframe surface. In the following process step of degating, the compound of the runners is broken off each gate and the attached length of the leadframe. The compound of the runners exerts resistance against the force needed in this removal step, since the compound adheres to the roughened leadframe surface. As a consequence, the leadframe metal is bent and distorted along the paths of the runners. FIG. 1A indicates the leadframe metal distortion 102 along the runner paths to each gate, as observable by a change of the optical light reflection of the plated metal. The top view photographs of FIGS. 1B and 1C illustrate more complete lengths 103 and 104 of distorted leadframe metal along the complete runner lengths.

Figure 2:
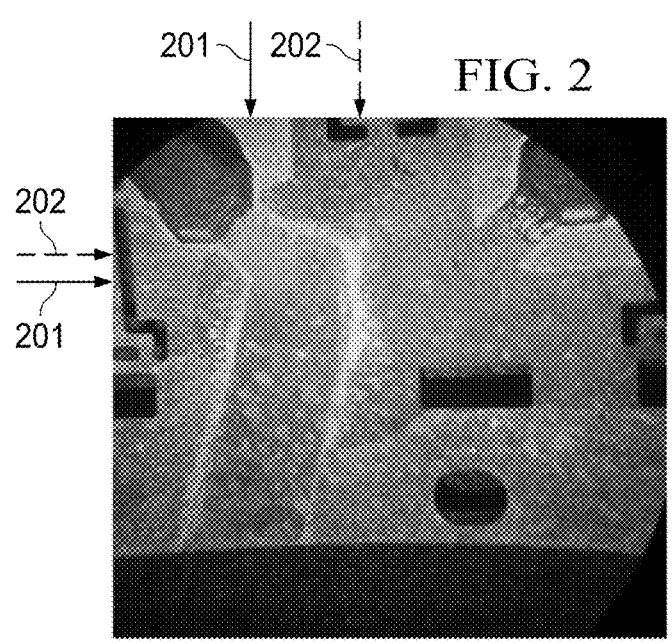
FIG. 2 shows a magnified perspective view of a leadframe location near the entry gate into a mold cavity, where molding compound in the feeding mold runner had been adhering to the leadframe metal.

A more detailed analysis of the extension of the distorted metal along the runner paths, as indicated for an example by the enlarged perspective photograph of FIG. 2, reveals the bending of the leadframe metal by the enhanced reflection of microscope light. It is noted how clearly the metal, distorted by the forceful removal of the adhering molding compound, follows the bend (arrows 201 and 202) in the path of the runner in front of the gate to the device cavity.

Figure 3:
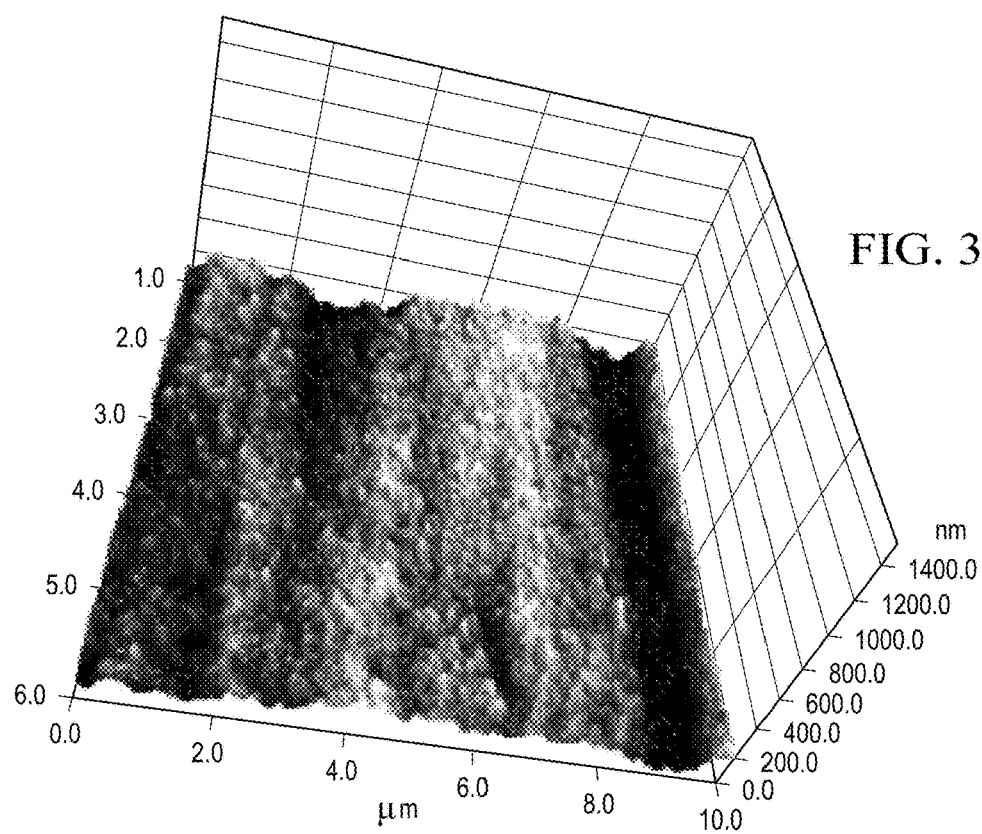
FIG. 3 is an AFM (Atomic Force Microscope) scan of a rough surface of a rough-plated nickel layer on copper.
Figure 4:
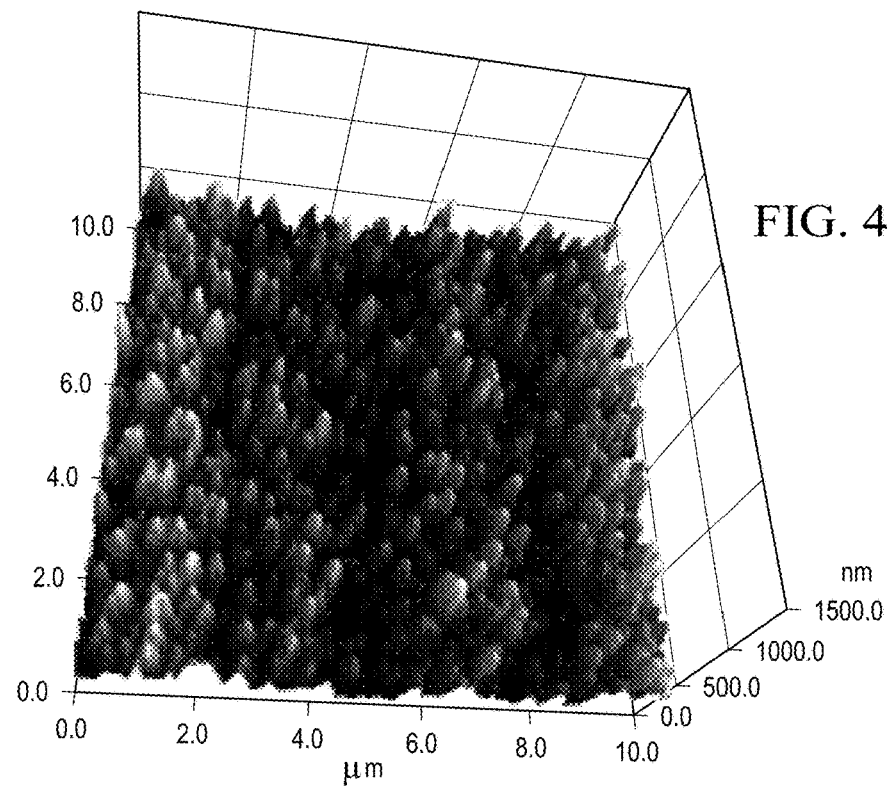
FIG. 4 is an AFM (Atomic Force Microscope) scan of a smooth surface of a plated nickel layer on copper.

The strong adhesion of the molding compound to the leadframe metal is explained by the amount of surface roughness of the plated metal layer on the leadframe. The Atomic Force Microscope (AFM) pictures of FIGS. 3 and 4 illustrate a quantitative comparison of the un-roughened nickel surface roughness of e the starting base copper leadframes and the roughened surface of the plated layer of nickel. FIG. 3 depicts a sample with the smooth (non-rough) plated surface, and FIG. 4 depicts a sample of the rough surface of the plated layer. The parameter most conveniently indicating the amount of roughness is the so-called surface area ratio S. Ratio S is defined as the surface area shown (three-dimensional) relative to a geometrically flat surface area (two-dimensional). The quantitative parameter values are based on a detailed analysis of the surface contours. The sample in FIG. 3 shows a surface area ratio of S=1.07, while the sample of FIG. 4 reveals a much larger surface area ratio of S=1.52. FIG. 3 indicates an average surface roughness of $R_a$=37±20 nm, while FIG. 4 shows a much large surface average roughness of $R_a$=80±20 nm. The root mean square of the sample in FIG. 3 is $R_{MS}$=47 nm, while the root mean square of the sample in FIG. 4 is $R_{MS}$=99 nm.

In order to selectively eliminate or at least reduce the adhesion to molding compound in zones of the plated leadframe surface, a stamping or punching tool suitable for planishing action can be constructed so that it is an additional feature of the already installed manufacturing machines for leadframe offsetting and cutting. (In the offset action, chip pads of the leadframe are depressed relative to the plane of the starting sheet, and in the cutting action, the leadframe sheet is cut into strips.) The planishing tool is preferably made of a hard, abrasion-resistant material such as stainless steel. Its surface involved in the stamping action is preferably flat. The contours of the stamping surface are designed to either affect the general leadframe area affected by unwanted adhesion to molding compound runners, as generally marked in FIG. 5, or to affect specifically selected leadframe areas, as indicated, for example, by the distortions observed in FIG. 2. The stamping force of the tool applied during its impact on the rough leadframe surface, can be varied and computer controlled. Due to the ability to set the stamping force to the desired level, the degree of smoothing a rough leadframe surface can be varied from just reducing rough peaks to almost complete flattening. Accordingly, a step between the un-planished area and the planished area will mark the borderline of the planishing action, the height of the step depending on the planishing force.

Figure 5:
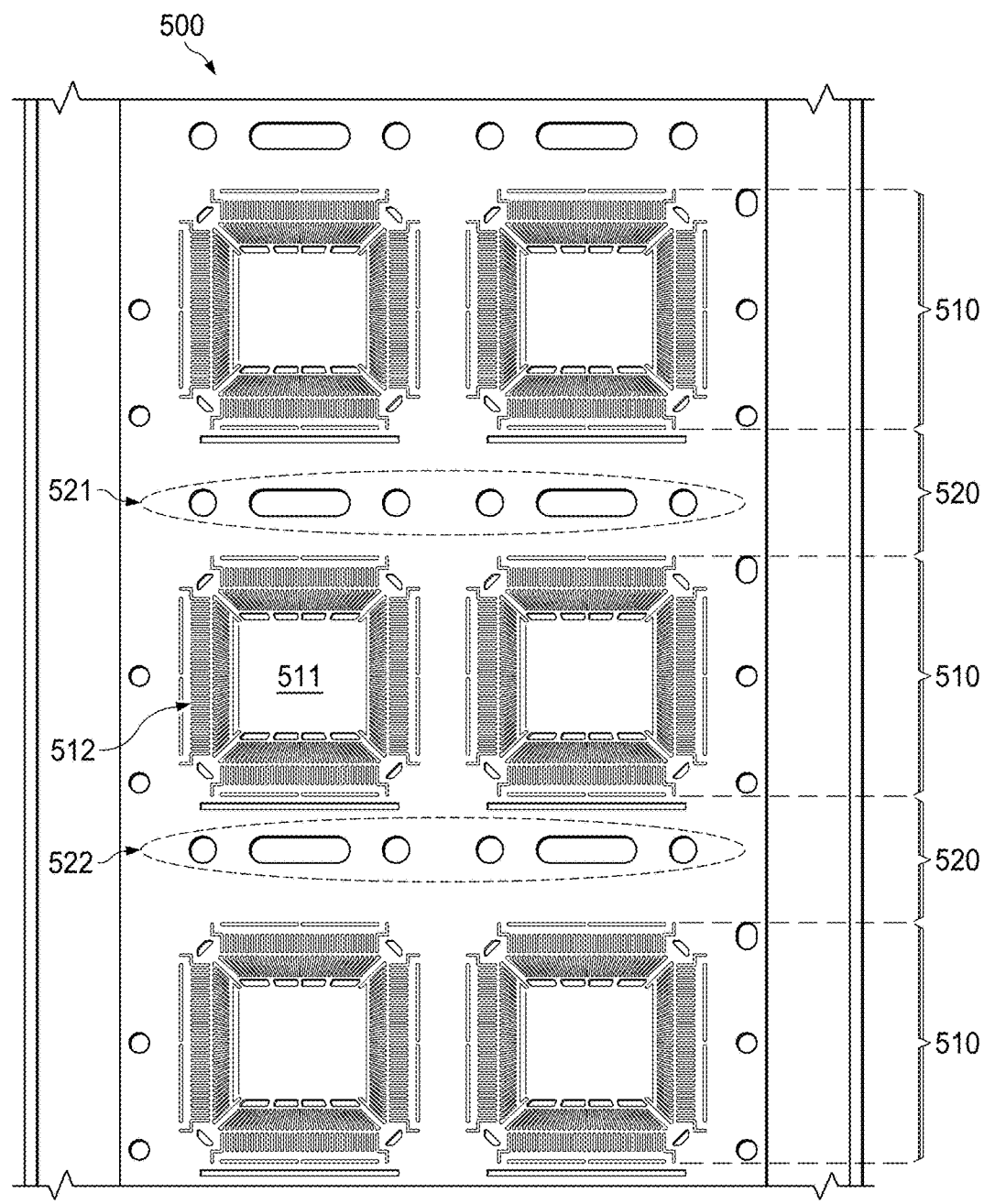
FIG. 5 shows a perspective view of a leadframe strip to indicate preferred areas for applying planishing action.

In the exemplary leadframe strip shown in FIG. 5 and generally designated 500, a plurality of sites 510 are designed to assemble semiconductor chips. Sites 510 alternate with zones 520 for connecting the leadframe to the runners delivering the molding compound to the cavities in the steel mold. Sites 510 have a mechanically rough and optically matte surface; some of these surfaces are designated 511 and 512 in FIG. 5. Preferably, both sides of the leadframe have rough surface. In contrast, zones 520 have at least portions with mechanically flattened and optically shiny surfaces, approximately outlined as areas 521 and 522 in FIG. 5. These flattened and shiny areas of zones 520 are created by planishing actions to smoothen and flatten surface roughness for reducing and preventing unwanted adhesion to polymeric encapsulation compounds after the packaging process.

A specific planishing tool should be designed so that the planishing action of the tool captures the layout of the runners for the polymeric compound and especially includes those leadframe surfaces, which are in close proximity to the device gates. Preferably the planishing tool should be designed so that the planishing action on the leadframe captures even a distance of about 10 to 20 μm inside the gate, i.e. 15±5 μm inside the perimeter of the package-to-be-created.

As an example, a planishing tool shaped approximately like the imprint depicted in FIG. 2 would be capable of planishing a leadframe area contacted by the molding compound in the runner crossing the leadframe surface in order to reach the gate; such tool is capable of reducing the surface roughness just in the area where strong metal adhesion to the molding compound is causing the detrimental deformation illustrated in FIG. 2. As mentioned, when the planishing tool impacts the rough leadframe surface, the impact force may create a step between the planished (smoothened) and un-planished (still rough) surface areas.

The magnified microscopic photographs of FIGS. 6 and 7 illustrate examples of the effect of planishing action on a nickel-plated layer deposited on the surface of a copper leadframe. At a magnification of 5000×, the top view of FIG. 6 shows a rough-plated section at the right hand side of the figure, approximately up to the arrows, and a planished section at the left hand side. The force used in the planishing action was relatively light, but clearly resulted in a partial flattening of the steep peaks dominant in the un-planished section.

At a magnification of 8000×, the slightly perspective view of FIG. 7 shows the step between a planished (bottom section) and a non-planished (top section) surface. The force in the planishing action was relatively light so that the step is only about 1.5 µm high. Using a considerably stronger force for the impact, the planishing action may result in a thickness reduction of the plated metal between about 5 and 15%. At a 10% reduction of the leadframe thickness of 150 µm, the thickness reduction and thus the step may amount to about 15 µm. Experiments have shown that the flatness of the surface corresponding to a thickness reduction of about 5 to 10% will diminish the adhesion to the leadframe metal of the molding compound along the path of the runner to such degree that it has practically vanished.

While plated metal with rough surfaces has a matte optical appearance, a planished surface looks more reflective and shiny. It is, therefore, easy to identify the extent of a planishing action by a simple optical inspection. In order to maximize adhesion between polymeric compounds and metal leadframes, it is advantageous to have rough and thus matte surfaces on both sides of a leadframe. The planishing action, on the other hand, is advantageous only on the leadframe side where the mold runners are positioned. It would, therefore, be sufficient to use the planishing tool only on one side of the leadframe. From a practical fabrication standpoint, however, counterbalancing the impact force of the planishing tool is most easily achieved by planishing corresponding areas on both sides of a leadframe.

A surface step of the order of 10 µm is clearly visible in an unaided-eye inspection of a leadframe surface, especially when accompanied by a change in optical reflectivity. The application of a planishing tool by a leadframe supplier is thus easily detectable in the proximity of mold gates. Since the step of trimming the leadframe for singulating the finished package after completing the encapsulation step will likely remove the planished leadframe portions, only about 10 to 20 µm inside the gate of the finished package will continue to show marks of the planishing action.

Another embodiment of the invention is a method for fabricating a leadframe strip for use in plastic encapsulated semiconductor devices. Certain steps of the process flow are shown in the block diagram of FIG. 8. In step 801, the geometrical form of a leadframe is etched or stamped from a starting sheet of a base metal. As stated above, preferred base metals include copper, copper alloy, iron-nickel alloy, aluminum, and Kovar™, and preferred starting sheets are in the thickness range from 120 to 250 µm; thicknesses under 100 µm are becoming more common. The term base metal has the connotation of starting material and does not imply a chemical characteristic.

In the next step 802, the leadframe is plated to promote bondability and solderability and to enhance adhesion to polymeric encapsulation compounds. Preferred metals for plating include nickel, palladium, gold, and combinations and alloys thereof. For some devices, another option includes tin. For strengthening adhesion without additional cost, it is preferred to employ a flood roughening technique involving the entire leadframe surface, preferably on both sides of the leadframe. A preferred roughness is in the range of 90±20 nm, which results in a surface area ratio of about 150 to 160 square-units for a square area measuring 10 by 10 units side-length (instead of a surface area ratio of 100 square-units for a flat surface). The 50 to 60% increase in active surface originates the enhanced adhesion. It has been described above that the strong adhesion has the unwelcome side-effect of leadframe deformation in the degating and deflashing process steps. To prevent these side effects, the next process step includes the feature of adding a light coining step for reducing or removing the rough texture in selected leadframe zones, especially in the neighborhood of the mold gate areas.

In step 803, the standard machine for off-setting (depressing chip pads from the sheet plane) and cutting (creating leadframe strips) is enriched by an additional station for planishing. By adding the planishing tool to an existing machine, no extra process step is needed and the planishing step remains low cost. In the planishing process step, the computer-controlled machine positions the leadframe sheet precisely under the planishing tool, which is shaped to impact selected areas of the leadframe on both sides of the sheet. Controlled by the computer, the planishing tool impacts the selected area with pre-determined force. Process control can verify the planishing result by visual inspection, since the impact changes the optical reflection of the leadframe surface to shiny from matte.

The computer-controlled machine for process step 803 may execute the functions of offsetting, planishing, and cutting simultaneously or consecutively.

After leadframe strips have been cut from the sheet in step 803 in the next station of the machine, the strips are shipped in step 804 to the next process stations for assembling and packaging semiconductor chips.

Figure 9A:
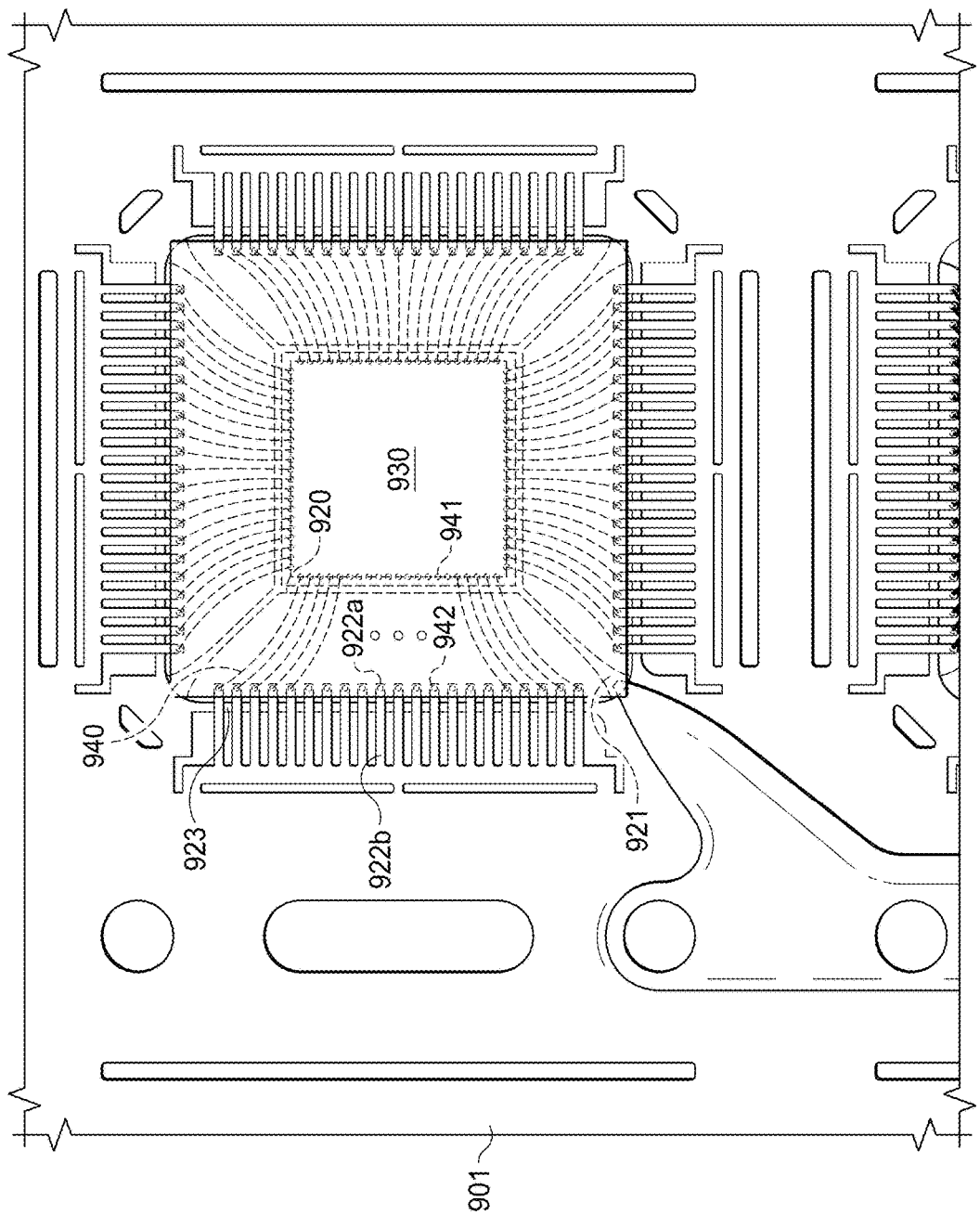
FIG. 9A shows a top view of a unit of a leadframe strip for Quad Flat Packages (QFP) with an assembled and molded chip after degating including a mechanically smooth surface portion surrounded by rough leadframe surfaces.
Figure 9B:
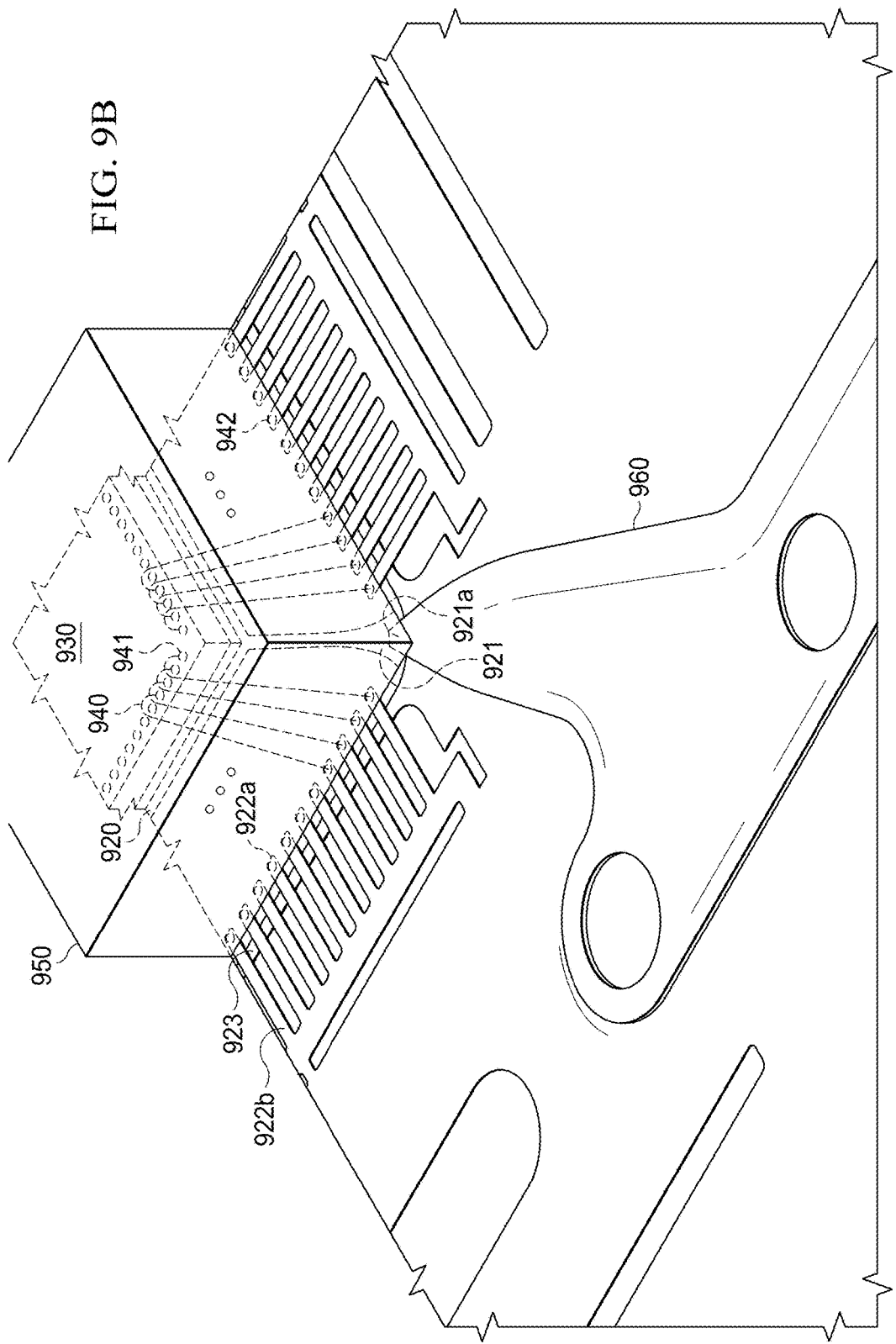
FIG. 9B illustrates a perspective view of the unit of FIG. 9A, including a portion adjacent to the exposed leadframe strap end, which has a mechanically smooth surface transitioning into the rough surface of the remainder of the strap.

FIGS. 9A and 9B illustrate the result of the assembling and packaging process steps for an example of the Quad Flat Package (QFP) family. FIG. 9A shows the result after the steps of attaching and wire bonding a semiconductor chip on a unit of an exemplary leadframe strip 901. The unit of the leadframe includes a pad 920 for attaching the chip; pad 920 is held by straps 921 onto the rails of the leadframe. The unit further includes a plurality of leads, each lead having a first portion 922a near chip pad 920 and a second portion 922b remote from the chip pad. The leads are stabilized for the wire bonding process by rails 923, which will be cut out (trimmed) after the encapsulation step. Pad 920, straps 921, and the leads 922a, 922b have a mechanically rough surface as described above.

In the example of FIG. 9A, a semiconductor chip 930 is attached to pad 920 and bonded by wires 940 to the first lead portions 922a. Preferably, the wire bonding comprises ball bonding with the balls 941 attached to chip 930 and stitches 942 attached to first lead portions 922a.

In FIG. 9B, a package of plastic compound 950 (preferably opaque, but shown as being transparent for clarity purposes) is encapsulating chip 930, pad 920, straps 921, the bonding wires 940, and the first lead portions 922a. The second lead portions 922b are left un-encapsulated. The preferred encapsulation method is a transfer molding technique using a polymeric epoxy compound mixed with a high percentage of inorganic fillers.

After completing the encapsulation step, the leadframe strip with the packaged devices is subjected to the trimming operation of the leadframe rails and the forming operation of the exposed second lead portions 922b. The trimming step also cuts the straps from the leadframe rails so that the strap ends are exposed on the surface of the package.

As FIG. 9B illustrates, at least one of the straps includes a portion 921*a* adjacent to the exposed strap end, the portion having a mechanically smooth surface transitioning by a step into the rough surface of the remainder of the strap. FIG. 9B shows that portion 921*a* is a protuberance of the planished zone 960 of the leadframe, which had been flattened to create low adhesion of molding compound to mold runners, and thus to enable easy removal of residual compound for device singulation.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to all leadframe-based semiconductor packages.

As yet another example, the invention applies to any shape of the planishing tool and to any degree of planishing effect.

It is therefore intended that the appended claims encompass any such modifications or embodiment.

I claim:

1. A method of fabricating semiconductor device comprising:
    forming a leadframe having a pad with a plurality of straps, and a plurality of leads including first and second portions, each one of the plurality of straps has an end;
    roughing the pad, the plurality of straps, and the plurality of the leads;
    attaching a semiconductor chip to the pad;
    wire bonding the semiconductor chip to the first lead portions;
    encapsulating with a compound the semiconductor chip, the pad, the plurality of straps, the bonding wires and the first lead portions, leaving the second lead portions un-encapsulated;
    exposing at least one of the plurality of strap ends; and
    selectively planishing a portion adjacent to the at least one of the plurality of the exposed strap ends.

2. The method of claim 1 further including transitioning by a step into the rough surface of the remainder of the strap.

3. The method of claim 1, wherein roughing includes roughing both sides of the leadframe.

4. The method of claim 1, wherein planishing includes planishing both sides of the leadframe.

5. The method of claim 1 wherein the rough metal surfaces have been created by a flood roughening method.

6. The method of claim 1 wherein the rough metal surfaces have been created by a mechanical roughening method.

7. The method of claim 1 wherein roughing is done to an average roughness of 90±20 nm, enhancing the adhesion of the leadframe metal to the encapsulating compound.

8. The method of claim 7, wherein the planishing process causes a thickness reduction of the rough-surface leadframe metal by 10±5%.

9. The method of claim 8 wherein a step spacing the planished surface portions from the rough surface portions equals the thickness reduction of the rough-surface leadframe metal.

10. The method of claim 1 wherein the strap portion at the strap end having a smooth surface extends about 15±5 μm inside from the strap end.

* * * * *